(12) United States Patent
Kim et al.

(10) Patent No.: US 10,820,436 B1
(45) Date of Patent: Oct. 27, 2020

(54) UTILITY BOX

(71) Applicant: TSC INC., Hwaseong-si, Gyeonggi-do (KR)

(72) Inventors: Oh Su Kim, Gyeonggi-do (KR); John Ho Kuk, Gyeonggi-do (KR); Woo-Seung Kim, Suwon-si (KR)

(73) Assignee: TSC INC., Gyeonggi-Do (KR)

( * ) Notice: Subject to any disclaimer, the term of this patent is extended or adjusted under 35 U.S.C. 154(b) by 0 days.

(21) Appl. No.: 16/787,098

(22) Filed: Feb. 11, 2020

(30) Foreign Application Priority Data

Jun. 17, 2019 (KR) .......................... 10-2019-0071341

(51) Int. Cl.
*H05K 5/02* (2006.01)
*H05K 5/00* (2006.01)

(52) U.S. Cl.
CPC ......... *H05K 5/0239* (2013.01); *H05K 5/0004* (2013.01); *H05K 5/0221* (2013.01)

(58) Field of Classification Search
CPC ... H05K 5/0239; H05K 5/0004; H05K 5/0221
See application file for complete search history.

(56) References Cited

U.S. PATENT DOCUMENTS

| | | | | |
|---|---|---|---|---|
| 4,799,435 A * | 1/1989 | Boutroy | ................. | G07D 11/12 109/25 |
| 5,967,392 A * | 10/1999 | Niemi | ....................... | B60R 9/00 16/289 |
| 6,279,768 B1 * | 8/2001 | Mendoza | ................. | H02G 3/10 220/3.8 |
| 9,800,033 B1 * | 10/2017 | Elbaz | ..................... | H02G 3/081 |
| 9,997,897 B2 * | 6/2018 | Gong | ..................... | H02G 15/10 |
| 2006/0037773 A1 * | 2/2006 | Castaldo | ................ | H02G 3/088 174/66 |
| 2011/0203334 A1 * | 8/2011 | Rix | ......................... | E05B 61/00 70/158 |
| 2012/0049700 A1 * | 3/2012 | Cochrane | ............. | H05K 9/0009 312/223.2 |

(Continued)

FOREIGN PATENT DOCUMENTS

JP         63-99885 U      6/1988
KR    10-2011-0111026 A    10/2011

OTHER PUBLICATIONS

Korean Office Action Corresponding to 10-2019-0071341 dated Oct. 26, 2019.

*Primary Examiner* — Timothy J Thompson
*Assistant Examiner* — Rhadames Alonzo Miller
(74) *Attorney, Agent, or Firm* — Davis & Bujold PLLC; Michael J. Bujold

(57) ABSTRACT

A utility box which includes a concave-shaped box having a box opening on a top end of the box and a cover plate installed on the box to cover the box opening. The box has a box body, a box shoulder, and a box opening formed on the top end of the box. A pair of lower horizontal guide surfaces are disposed parallel to each other. The box shoulder has a shoulder body and a pair of upper horizontal guide surfaces. A cover plate is formed to have a cover plate wide width portion and is installed in such a manner that the cover plate wide width portion is supported on the lower horizontal guide surfaces. A cover plate opening/closing support controls the cover plate. The box body has improved inner space utilization and a region of its cover plate has a simple structure.

4 Claims, 13 Drawing Sheets

(56) References Cited

U.S. PATENT DOCUMENTS

| | | | |
|---|---|---|---|
| 2012/0293339 A1* | 11/2012 | Milon | H05K 5/0021 |
| | | | 340/870.02 |
| 2013/0256256 A1* | 10/2013 | Krippendorf | E05B 43/005 |
| | | | 215/200 |
| 2013/0319716 A1* | 12/2013 | Rost | H05K 5/061 |
| | | | 174/50.5 |
| 2014/0247554 A1* | 9/2014 | Sharma | H01F 27/28 |
| | | | 361/695 |
| 2014/0374133 A1* | 12/2014 | Rost | H05K 5/061 |
| | | | 174/50.51 |
| 2015/0219389 A1* | 8/2015 | Schaefer | F25D 27/00 |
| | | | 362/94 |
| 2015/0354595 A1* | 12/2015 | Su | F24F 1/56 |
| | | | 415/201 |
| 2015/0366095 A1* | 12/2015 | Junkins | H05K 5/0256 |
| | | | 361/679.31 |
| 2016/0137343 A1* | 5/2016 | Weng | B65D 19/42 |
| | | | 206/386 |
| 2016/0215526 A1* | 7/2016 | AbuGhazaleh | H05K 7/186 |
| 2016/0327251 A1* | 11/2016 | Clark | F21V 21/044 |
| 2017/0257958 A1* | 9/2017 | Sabbag | G10K 9/22 |
| 2019/0148926 A1* | 5/2019 | Travis | H02G 3/185 |
| | | | 220/3.3 |
| 2020/0113068 A1* | 4/2020 | Riedl | H05K 1/02 |

* cited by examiner

UTILITY BOX

BACKGROUND

Field

The present disclosure relates to a utility box, and more particularly, to a box used to supply a production facility or the like with a utility, such as electricity or gas, which is required for producing a product such as a semiconductor or an electronic device.

Description of the Related Art

To produce a product such as a semiconductor or an electronic device, it is necessary to supply a production facility with utilities such as a power source including electricity, a cooling source including gas and a heating source including a steam. To this end, a utility supply facility is installed in a region adjacent to the production facility.

A method of installing a utility box in the region adjacent to the production facility has been devised and used as follows: to distribute the utilities to the production facilities efficiently (i.e., to distribute the utilities supplied from a single utility source to multiple uses); to secure a space for storing a utility supply device such as an air gun; to reduce an installation space of the utility supply facility; or to minimize a change in the utility supply facility due to a design change in the production facility.

The utility box is installed mainly on a floor and installed in such a manner that an inner space of the box is accessible from outside the box.

FIG. 12 is a perspective view showing a conventional utility box, and FIG. 13 is a cross-sectional view showing a utility box having a conventional cover plate in an opened position.

As shown in these drawings, the conventional utility box has a concave-shaped box 110, a pair of cover plates 130 installed on top ends of the box 110 and a cover plate locking device 183 installed on each of the cover plates 130.

The box 110 has a concave-shaped box body 111 having a rectangular box opening 111a formed on a top end thereof and a box shoulder 120 coupled to the top end of the box body 111.

The box shoulder 120 has a shoulder body 121 formed to have an inner circumferential surface in a shape of a rectangular closed loop and a shoulder partition wall 122 coupled to the shoulder body 121 to divide an opening region of the shoulder body 121.

The pair of cover plates 130 are installed on both sides of the shoulder partition wall 122, respectively, to close the opening regions of the shoulder body 121 divided by the shoulder partition wall 122.

Each of the cover plates 130 is installed to approach the shoulder partition wall 122 through a hinge 133 and to be pivoted in a direction away from the shoulder partition wall 122.

The pair of cover plates 130 may be opened and closed separately from each other by operating each cover plate locking device 183.

Hereinafter, the description focuses on a method of using the conventional utility box having the above-described configuration with reference to FIG. 13. For convenience of explanation, it is assumed that the utility supply device such as the air gun or an accessory is installed in an inner space of the box body 111.

First, the cover plate locking device 183 is released, and the cover plates 130 are then pulled upward one by one. When pulled upward, each of the cover plates 130 is moved to an opened position as shown in FIG. 13.

In a state where each cover plate 130 is disposed in the opened position as shown in FIG. 13, the box opening 111a may be accessible from outside the box in two directions (i.e. the directions without the cover plates, respectively).

In the state where each cover plate 130 reaches the opened position, it is possible to use the air gun or the like installed in the inner space of the box body 111.

Meanwhile, each cover plate 130 is returned to a closed position by an operation to press the cover plate 130 downward.

In a state where the conventional utility box is installed, each cover plate 130 is restrained to the box 110 by the hinge 133. Therefore, each cover plate 130 may be prevented from being separated from the box 110, thereby preventing a safety accident caused by the separation of the cover plate 130.

However, according to the conventional utility box, each cover plate 130 is limited to be opened position in one direction and the inner space of the box body 111 thus has lower utilization.

That is, the pair of cover plates 130 are installed on the box 110 to be opposite to each other and pivoted in the opposite directions. Therefore, the box opening 111a is accessible from outside the box in only two directions and the inner space of the box body 111 thus has the lower utilization.

In addition, the shoulder partition wall 122 is installed at a center of the box opening 111a, thereby interrupting an operation to enter the inner space of the box body 111. Therefore, the inner space of the box body 111 thus has the lower utilization.

In addition, the cover plates 130 are configured as the pair and the cover plate locking device 183 is required to be installed for each cover plate 130 to prevent a pivot operation of the hinge 133. Therefore, a region of the cover plate 130 has a complicated structure.

Related prior art documents include Korean Patent Laid-Open Publication No. 10-2011-0111026 (published on Oct. 10, 2011, and entitled 'Floor Utility Box'). This prior art document discloses a technique related to the conventional utility box described above.

SUMMARY

An object of the present disclosure is to provide a utility box in which its box body has improved inner space utilization and a region of its cover plate has a simple structure.

According to an embodiment of the present disclosure, there is provided a utility box including: a concave-shaped box having a box opening on a top end of the box and a cover plate installed on the box to cover the box opening, wherein the box has a box body and a box shoulder, the concave-shaped box body having a box opening formed on the top end of the box and a pair of lower horizontal guide surfaces which are disposed parallel to each other at outer sides of the box opening to form straight lines, respectively, and the box shoulder having a shoulder body and a pair of upper horizontal guide surfaces, the shoulder body being formed to extend from a top end of the box body to have an inner circumferential surface in a shape of a closed loop and formed to have a pair of perpendicular guide surfaces which are disposed parallel to each other on inner circumferential surfaces of the shoulder body to form straight lines, respectively, and simultaneously disposed at outer sides of the lower horizontal guide surfaces to be perpendicular to the lower horizontal guide surfaces, respectively, and the pair of upper horizontal guide surfaces being disposed above and parallel to the lower horizontal guide surfaces, started from longitudinal ends of the perpendicular guide surfaces on the same sides as the upper horizontal guide surfaces, respectively, and formed to extend from top ends of the perpendicular guide surfaces toward the inside of the box body to have length sections shorter than the lower horizontal guide surfaces, respectively; and wherein the cover plate is formed to have a cover plate wide width portion having the same width as a separation distance between the perpendicular guide surfaces and a cover plate narrow width portion formed to extend from the cover plate wide width portion to have a width smaller than the cover plate wide width portion; the cover plate is installed in such a manner that the cover plate wide width portion is supported on the lower horizontal guide surfaces and the cover plate narrow width portion enters between the upper horizontal guide surfaces; the cover plate is provided with a pair of wheels and a cover plate opening/closing support, the pair of wheels each being installed on a side of the cover plate narrow width portion to be rolling moved along the lower horizontal guide surface between a bottom of the upper horizontal guide surface and the lower horizontal guide surface, and the cover plate opening/closing support including a cover plate opening/closing support cylinder and a cover plate opening/closing support piston installed to have one end entering the cover plate opening/closing support cylinder; either one of a free end of the cover plate opening/closing support cylinder and a free end of the cover plate opening/closing support piston is pivotally coupled to a bottom surface of the cover plate, and the other end is pivotally coupled to the box body; and the cover plate opening/closing support is operated so that more of a section of the cover plate opening/closing support piston enters the cover plate opening/closing support cylinder while the cover plate is moved from an opened position to a closed position, and so that less of the section of the cover plate opening/closing support piston enters the cover plate opening/closing support cylinder while the cover plate is moved from the closed position to the opened position.

Here, in order to reduce an amount of shock delivered from the cover plate to the box even when a large closing force is applied to the cover plate during a closing operation of the cover plate, it is preferable that the cover plate opening/closing support further includes a cover plate opening/closing support spring installed in the cover plate opening/closing support cylinder so that as more of the section of the cover plate opening/closing support piston enters the cover plate opening/closing support cylinder, a damping force is generated to reduce a speed increasing the entry section.

In addition, in order to reduce an amount of shock delivered from the cover plate to the box even when a large closing force is applied to the cover plate when the cover plate reaches the closed position, it is preferable that the utility box further includes a contact shock absorber including: a contact shock absorber cylinder; a contact shock absorber piston installed to have one end entering the contact shock absorber cylinder; and a contact shock absorber spring installed in the contact shock absorber cylinder so that as more of a section of the contact shock absorber piston enters the contact shock absorber cylinder, a damping force is generated to reduce a speed increasing the entry section, wherein the contact shock absorber is fixedly installed to the box body by the contact shock absorber cylinder in such a manner that a top end of the contact shock absorber cylinder is disposed lower than the lower horizontal guide surface, a top end of the contact shock absorber piston is disposed higher than the lower horizontal guide surface, and the contact shock absorber cylinder is disposed in a height direction of the box body.

In addition, in order to stably hold the cover plate stably in the closed position, it is preferable that the box body has a region of the lower horizontal guide surfaces made of magnetic material; and the box body further includes a magnet attached to the cover plate wide width portion so that a magnetic force acts on the region of the lower horizontal guide surfaces when the cover plate is in the closed position.

DETAILED DESCRIPTION

Hereinafter, the present disclosure is described in detail with reference to the accompanying drawings.

Figure 1:
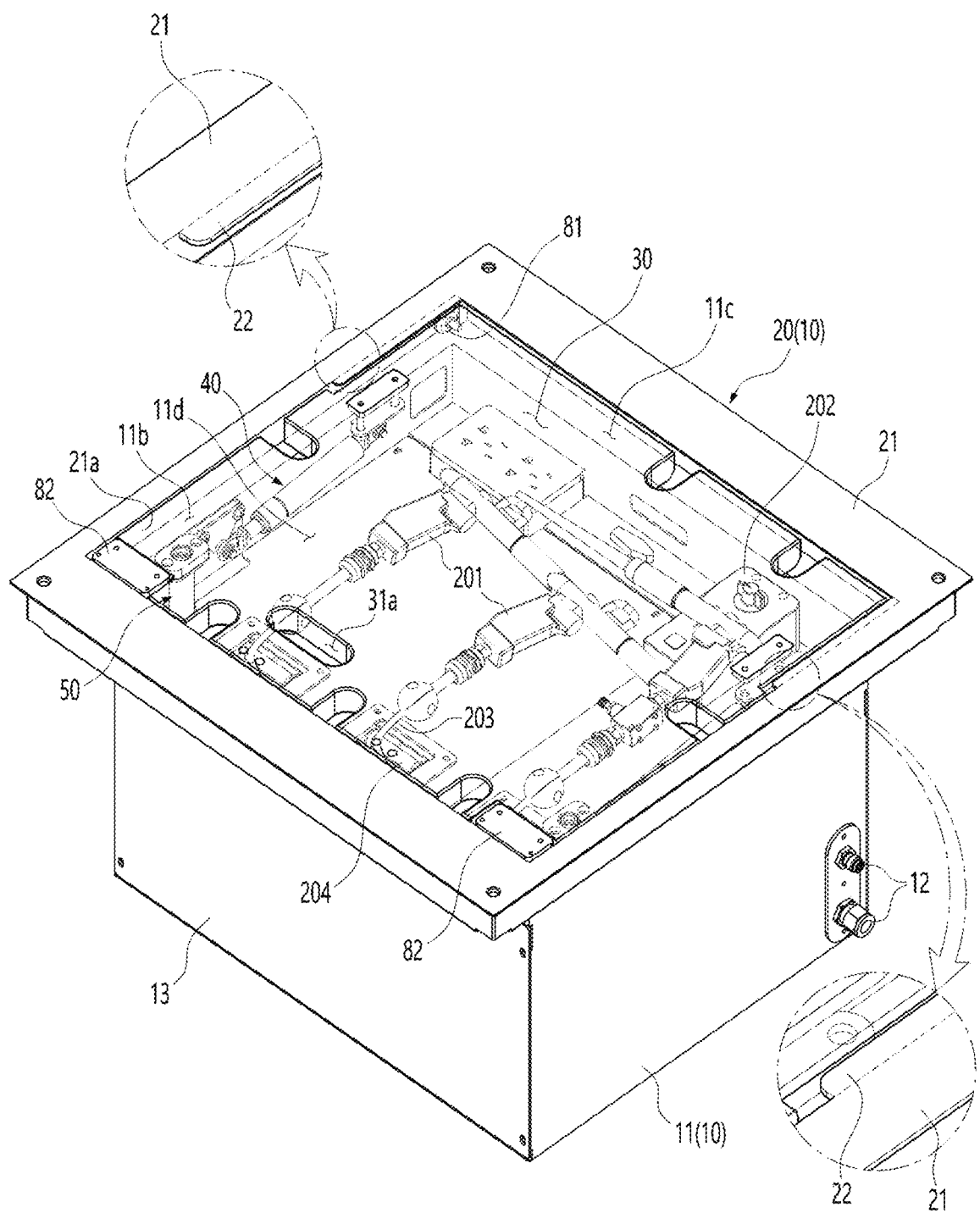
FIG. 1 is a perspective view showing a utility box having a cover plate in a closed position according to an embodiment of the present disclosure.
Figure 2:
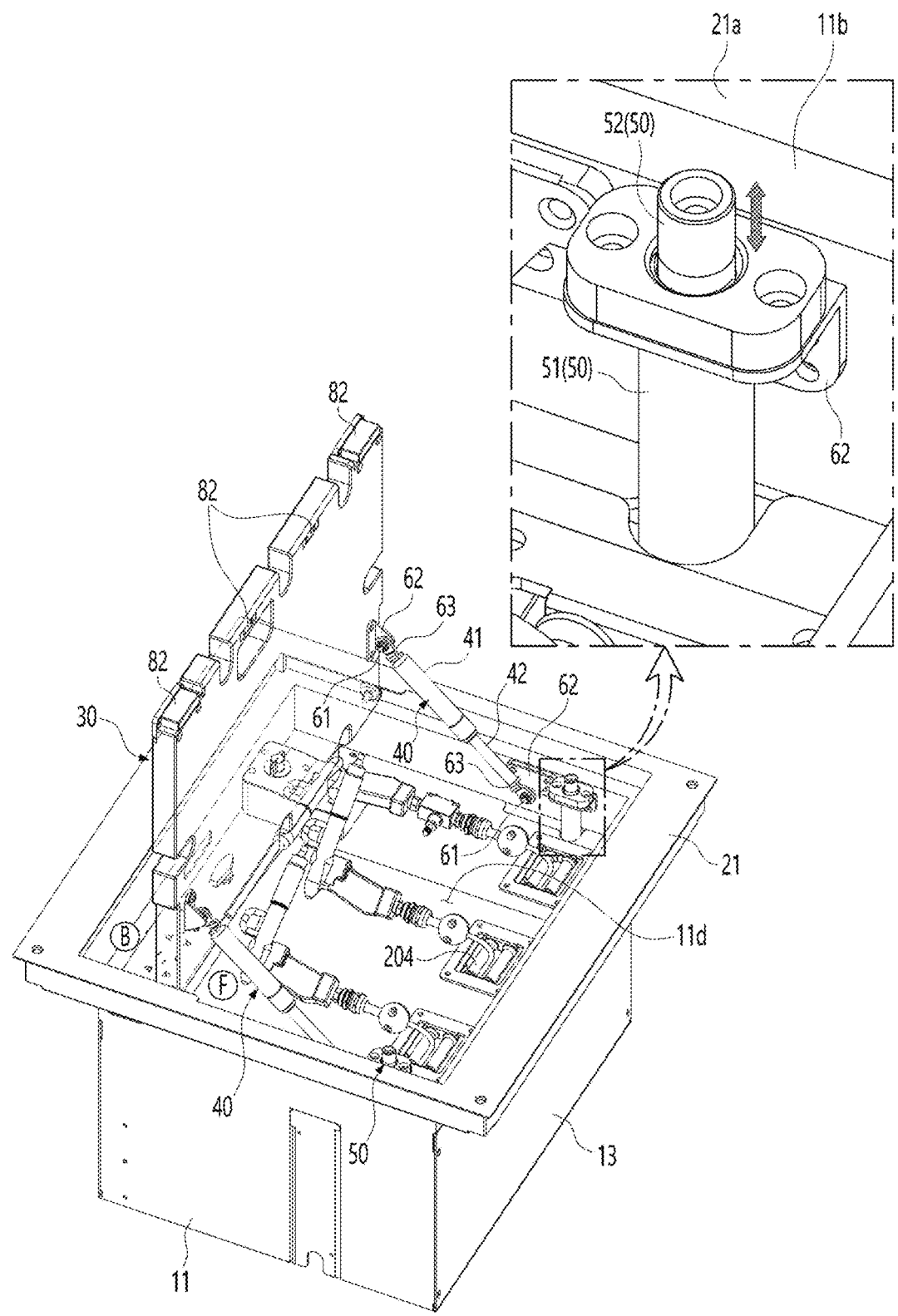
FIG. 2 is a perspective view showing a utility box having cover plate in an opened position according to an embodiment of the present disclosure.
Figure 3:
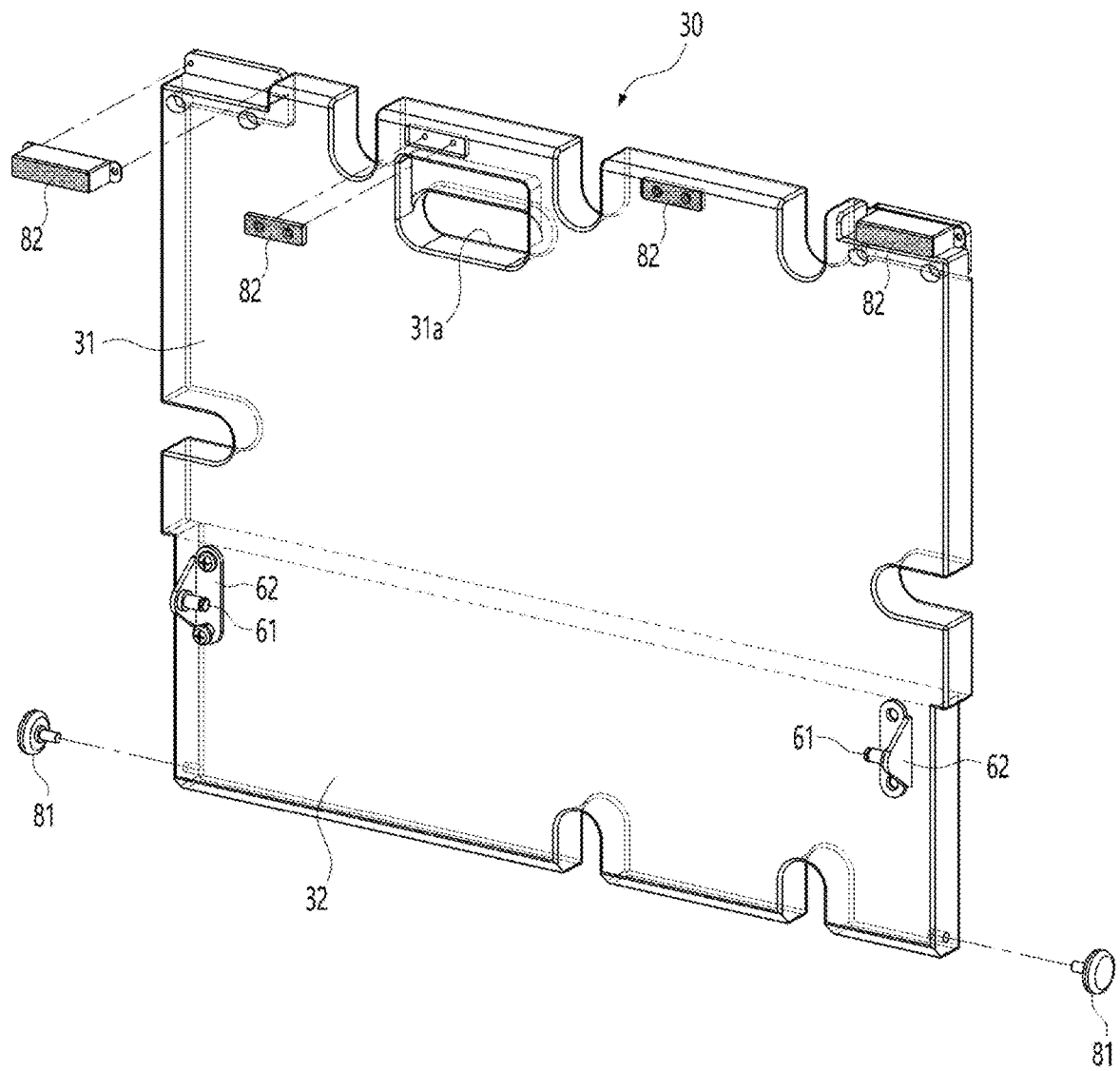
FIG. 3 is a view showing a cover plate according to an embodiment of the present disclosure.
Figure 4:
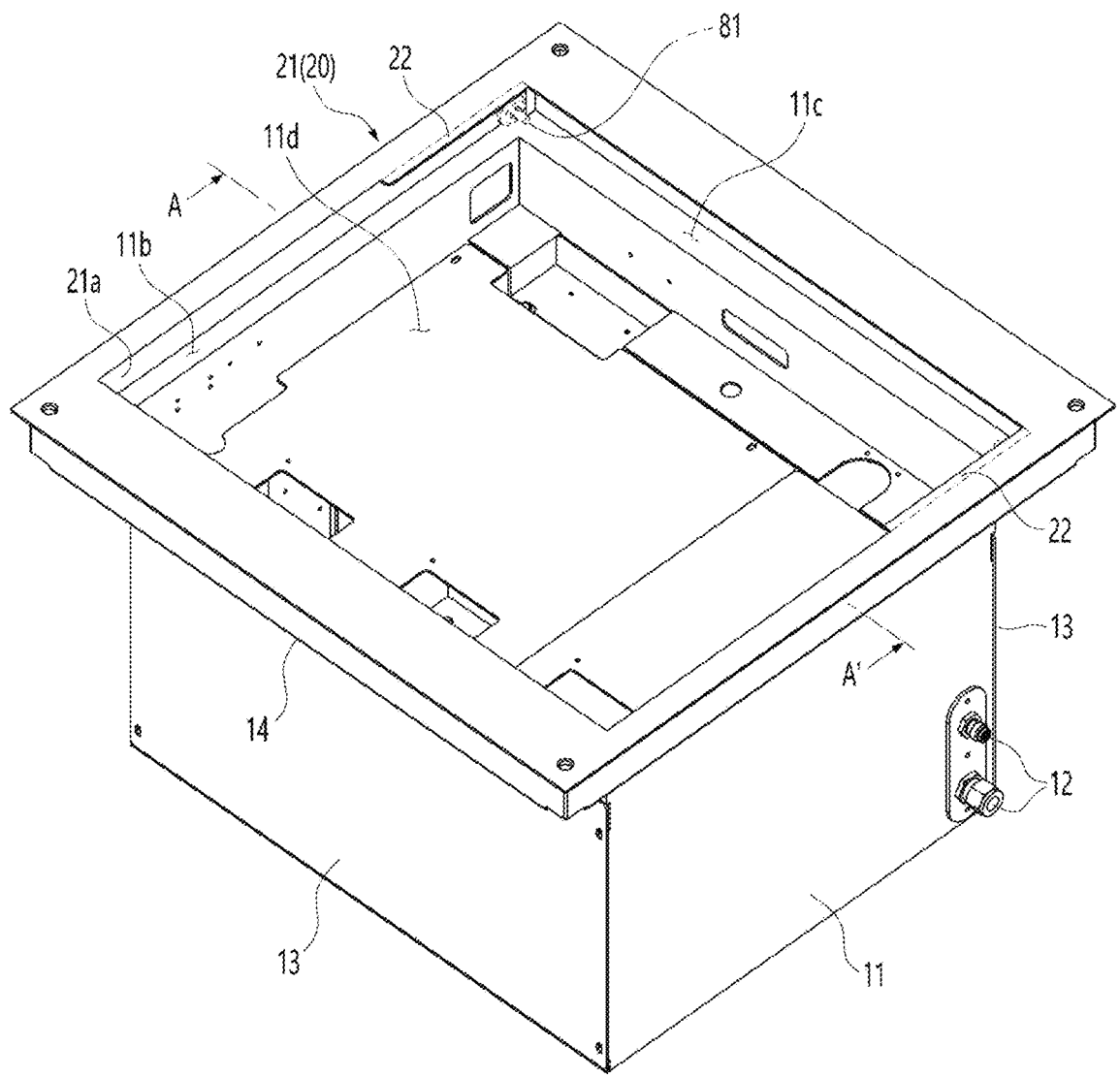
FIGS. 4 and 5 are views each showing a box region according to an embodiment of the present disclosure.
Figure 5:
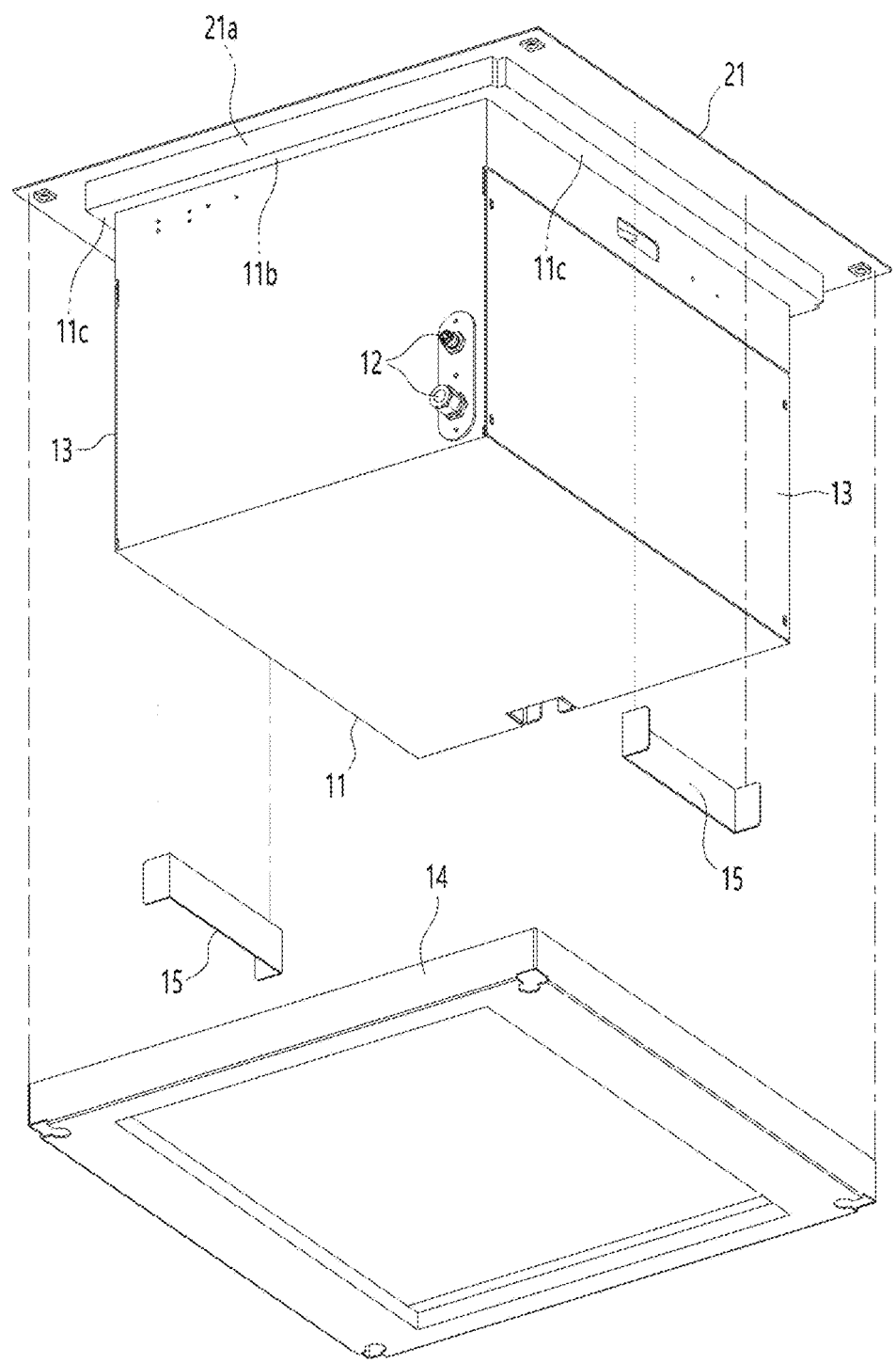
Figure 6:
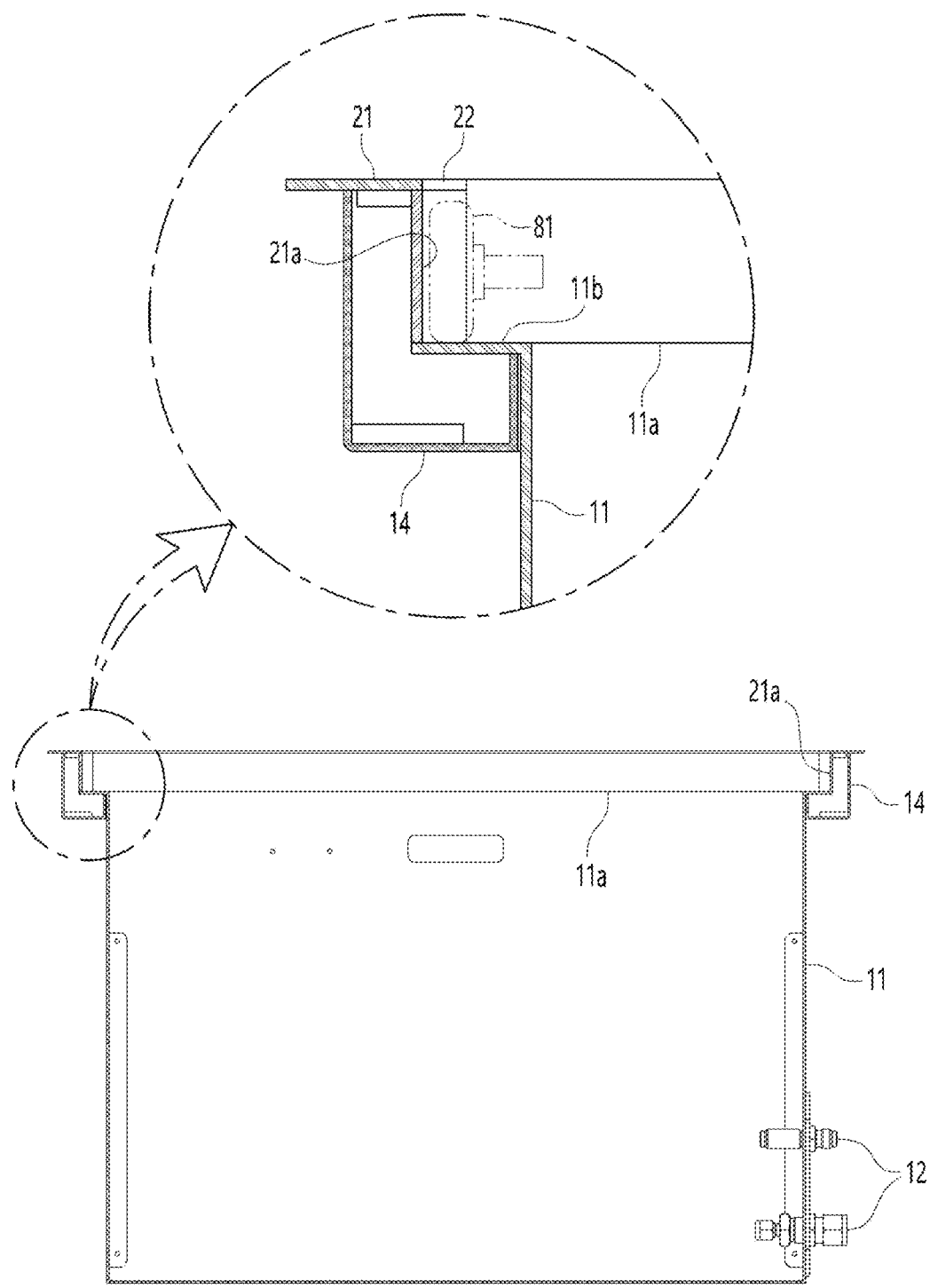
FIG. 6 is a cross-sectional view taken along line of FIG. 4.
Figure 7:
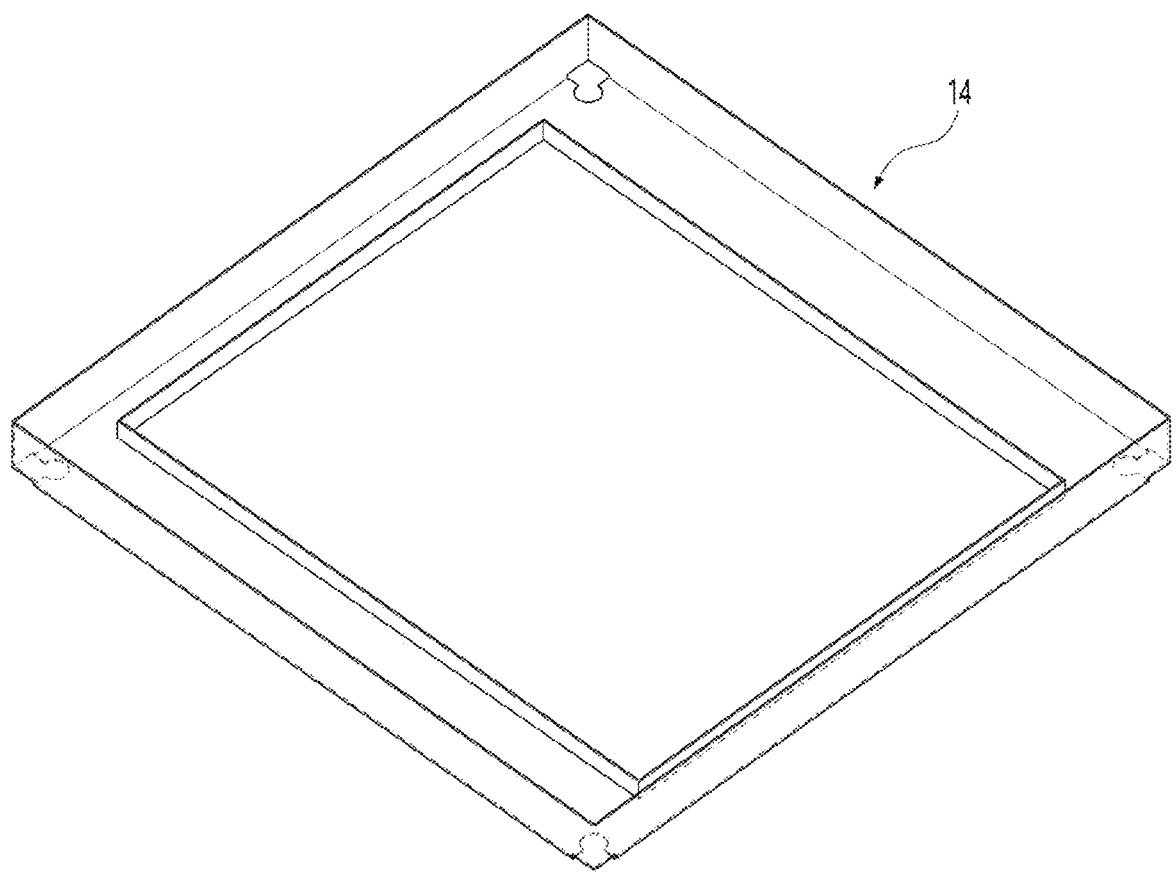
FIG. 7 is a view showing a support frame according to an embodiment of the present disclosure.
Figure 8:
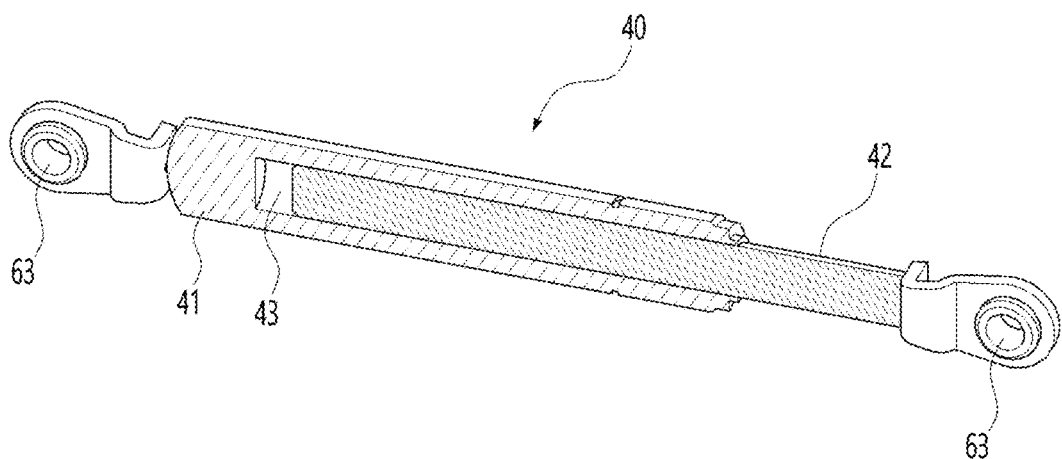
FIG. 8 is a cross-sectional view showing a cover plate opening/closing support according to an embodiment of the present disclosure.
Figure 9:
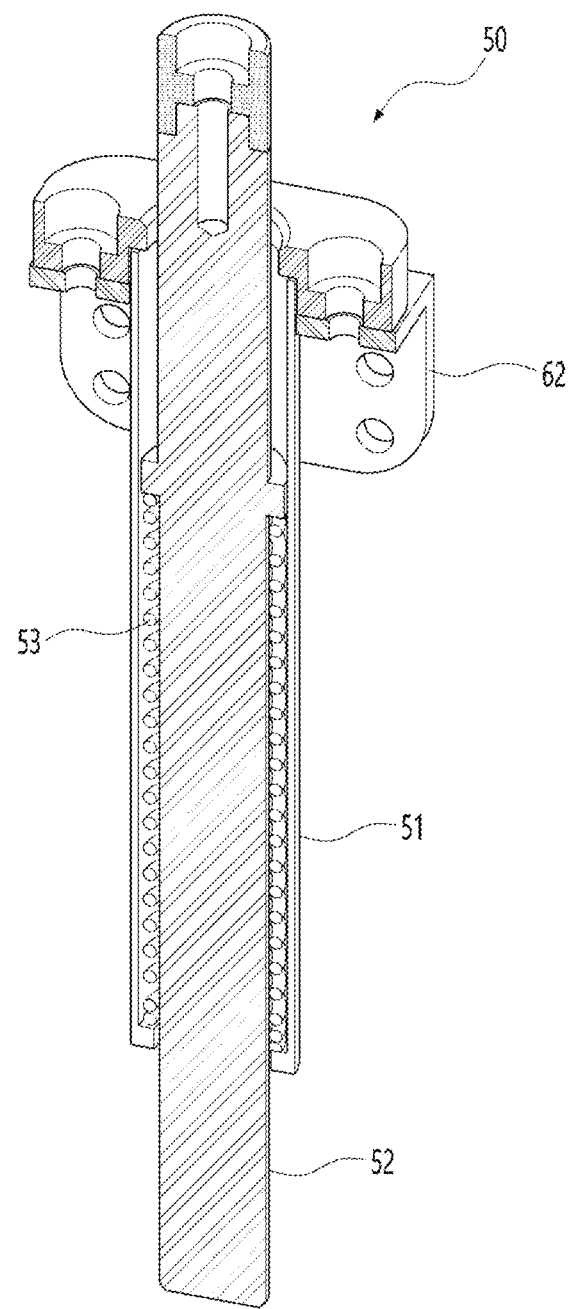
FIG. 9 is a cross-sectional view showing a contact shock absorber according to an embodiment of the present disclosure.

FIG. 1 is a perspective view showing a utility box having a cover plate in a closed position according to an embodiment of the present disclosure; FIG. 2 is a perspective view showing a utility box having a cover plate in an opened position according to an embodiment of the present disclosure; FIG. 3 is a view showing a cover plate according to an embodiment of the present disclosure; FIGS. 4 and 5 are views each showing a box region according to an embodiment of the present disclosure; FIG. 6 is a cross-sectional view taken along line A-A' of FIG. 4; FIG. 7 is a view showing a support frame according to an embodiment of the present disclosure; FIG. 8 is a cross-sectional view showing a cover plate opening/closing support according to an embodiment of the present disclosure; and FIG. 9 is a cross-sectional view showing a contact shock absorber according to an embodiment of the present disclosure.

As shown in these drawings, a utility box according to an embodiment of the present disclosure includes: a concave-shaped box 10; a cover plate 30 installed on a top end of the box 10; a pair of wheels 81 each installed on the cover plate 30; a magnet 82 attached to the cover plate 30; a cover plate opening/closing support 40 installed across the box 10 and the cover plate 30; and a contact shock absorber 50 installed on the box 10.

The box 10 has a concave-shaped box body 11 having a rectangular box opening 111a formed on the top end of the box and a box shoulder 20 coupled to a top end of the box body 11. The box body 11 is formed to have a pair of lower horizontal guide surfaces 11b disposed parallel to each other at outer sides of the box opening 11a to form straight lines, respectively.

The box body 11 is formed to have a pair of cover plate horizontal seating surfaces 11c disposed parallel to each other and connected with longitudinal ends of the lower horizontal guide surfaces 11b, respectively.

The box body 11 is partitioned into an upper space and a lower space by a box partition wall 11d disposed substantially parallel to the cover plate 30. The box partition 11d may be supported by a lattice-shaped support frame (not shown).

A reel for winding a tube 203 or the like may be installed in the lower space of the box body 11 (i.e., a space below the box partition wall), and a gas timer 202, the tube 203, an air gun 201 or the like may be installed in the upper space of the box body 11 (i.e., a space above the box partition wall).

In addition, a roller 204 for guiding unwinding and winding of the tube 203 is installed in the box partition wall 11d.

The following accessories may be installed on a side of the box body 11: an input port 12 for introducing a utility such as gas or electricity into the inner space of the box body 11 through a pipe, a wire or the like, a support wall 13 for supporting an accessory installed in the inner space of the box body 11, etc.

The box body 11 is made entirely of stainless material. The box body 11 may have a region of the lower horizontal guide surfaces 11b made only of magnetic material such as stainless material.

The box shoulder 20 has a shoulder body 21 and a pair of upper horizontal guide surfaces 22, the shoulder body 21 having a cross-section of an inverted L-shape and formed to extend from the top end of the box body 11 to have an inner circumferential surface in a shape of a rectangular closed loop, and the pair of upper horizontal guide surfaces 22 being formed to extend from the shoulder body 21.

The shoulder body 21 is formed to have a pair of perpendicular guide surfaces 21a which are disposed parallel to each other on inner circumferential surfaces of the shoulder body 21 to form straight lines, respectively, and simultaneously disposed at outer sides of the lower horizontal guide surfaces 11b to be perpendicular to the lower horizontal guide surfaces 11b, respectively.

The pair of upper horizontal guide surfaces 22 are disposed above and parallel to the lower horizontal guide surfaces 11b, started from longitudinal ends of the perpendicular guide surfaces 21a on the same sides as the upper horizontal guide surfaces 22, respectively, and extending from top ends of the perpendicular guide surfaces 21a toward the inside of the box body 11 to have length sections shorter than the lower horizontal guide surfaces 11b, respectively.

The box shoulder 20 having such a configuration may be formed integrally with the box body 11. However, for easy production, it is possible to separately produce a perpendicular section having the perpendicular guide surfaces 21a formed thereon and a horizontal section having the upper horizontal guide surfaces 22 formed to extend from the horizontal section, from each other. Thereafter, the two sections may be coupled to the box body 11 by welding or the like.

The cover plate 30 is formed to have a cover plate wide width portion 31 having the same width as a separation distance between the perpendicular guide surfaces 21a and a cover plate narrow width portion 32 formed to extend from the cover plate wide width portion 31 to have a width smaller than the cover plate wide width portion 31.

A gripping hole 31a is formed in the cover plate wide width portion 31.

In the cover plate 30 having such a configuration, the cover plate wide width portion 31 is supported on the lower horizontal guide surfaces 11b, the cover plate narrow width portion 32 enters between the upper horizontal guide surfaces 22, and the cover plate wide width portion 31 and the cover plate narrow width portion 32 are installed to be supported by the lower horizontal guide surfaces 11b and each of the pair of cover plate horizontal seating surfaces 11c, respectively.

The cover plate 30 may preferably be formed using a transparent material (such as acrylic).

A pair of wheels 81 are each installed on a side of the cover plate narrow width portion 32 to be rolling moved along the lower horizontal guide surface 11b between a bottom of the upper horizontal guide surface 22 and the lower horizontal guide surface 11b.

The magnet 82 is attached at an edge of the cover plate wide width portion 31. The magnet 82 may be attached to another position under a condition in which a magnetic force may act on a region of the lower horizontal guide surface 11b when the cover plate 30 is in the closed position.

In a state where the magnet 82 is attached in this way, the magnetic force acts to suppress an increase in magnetic resistance between the region of the lower horizontal guide surface 11b and the magnet 82 (lest a distance between the magnet and the lower horizontal guide surface is farther away). Accordingly, the cover plate 30 may be stably restrained in the closed position.

The cover plate opening/closing support 40 includes a cover plate opening/closing support cylinder 41, a cover plate opening/closing support piston 42 installed to have one end entering the cover plate opening/closing support cylinder 41, and a cover plate opening/closing support spring 43 installed in the cover plate opening/closing support cylinder 41.

In the cover plate opening/closing support 40 having such a configuration, an upper end of the cover plate opening/closing support cylinder 41 is pivotally coupled to a bottom surface of the cover plate 30, and a lower end of the cover plate opening/closing support piston 42 is pivotally coupled to the box body 11.

It is possible to couple the cover plate opening/closing support cylinder 41 to the cover plate 30 and the cover plate opening/closing support piston 42 to the box body 11, respectively, using a pivot pin 61, a support bracket 62 and a fastener 63.

The cover plate opening/closing support spring 43 may be implanted using a gas spring or the like, which is widely known in the prior art.

In a state of being installed, the cover plate opening/closing support 40 is operated so that more of a section of the cover plate opening/closing support piston 42 enters the cover plate opening/closing support cylinder 41 while the cover plate 30 is moved from the opened position to the closed position, and so that less of the section of the cover plate opening/closing support piston 42 enters the cover plate opening/closing support cylinder 41 while the cover plate 30 is moved from the closed position to the opened position.

As more of the section of the cover plate opening/closing support piston 42 enters the cover plate opening/closing support cylinder 41, a damping force is generated to reduce a speed increasing the entry section using friction between the cover plate opening/closing support spring 43 and the cover plate opening/closing support piston 42. In addition, as less of the section of the cover plate opening/closing support piston 42 enters the cover plate opening/closing support cylinder 41, a damping force is generated to reduce a speed decreasing the entry section using friction between the cover plate opening/closing support spring 43 and the cover plate opening/closing support piston 42.

The cover plate opening/closing support 40 having such a configuration may be implemented using a shock absorber widely used in the prior art.

A contact shock absorber 50 includes a contact shock absorber cylinder 51, a contact shock absorber piston 52 installed to have one end entering the contact shock absorber cylinder 51, and a contact shock absorber spring 53 installed in the contact shock absorber cylinder 51.

The contact shock absorber spring 53 is implemented in a form of a coil spring.

The contact shock absorber 50 having such a configuration is fixedly installed to the box body 11 by the contact shock absorber cylinder 51 in such a manner that a top end of the contact shock absorber cylinder 51 is disposed lower than the lower horizontal guide surface 11b, a top end of the contact shock absorber piston 52 is disposed higher than the lower horizontal guide surface 11b, and the contact shock absorber cylinder 51 is disposed in a height direction of the box body 11.

The contact shock absorber cylinder 51 may be coupled to the box body 11 using the support bracket 62 and the fastener 63.

In a state where the contact shock absorber 50 is installed, when the cover plate 30 moved from the opened position to the closed position presses the top end of the contact shock absorber piston 52, more of a section of the contact shock absorber piston 52 enters the contact shock absorber cylinder 51.

As more of the section of the contact shock absorber piston 52 enters the contact shock absorber cylinder 51, a damping force is generated to reduce a speed increasing the entry section using the contact shock absorber spring 53.

The contact shock absorber 50 having such a configuration may be implemented using a smove (damper) widely used in the prior art (see Korean Patent Registration Nos. 10-1782332, 10-1823404 and the like).

Hereinafter, the description focuses on a method of using the utility box which has the above-described configuration according to an embodiment of the present disclosure with reference to FIGS. 2, 10 and 11. For convenience of explanation, it is assumed that the utility box is installed on the floor of a building and a utility supply device such as an air gun or an accessory (such as a roller) may be installed in the lower space of the box body 11 (i.e., a space below the box partition wall) or the upper space of the box body 11 (i.e., a space above the box partition wall).

First, the cover plate 30 is pulled upward using the gripping hole 31a. The cover plate 30 may be pulled upward, either causing or not causing a rolling motion of the wheel 81.

Figure 10:
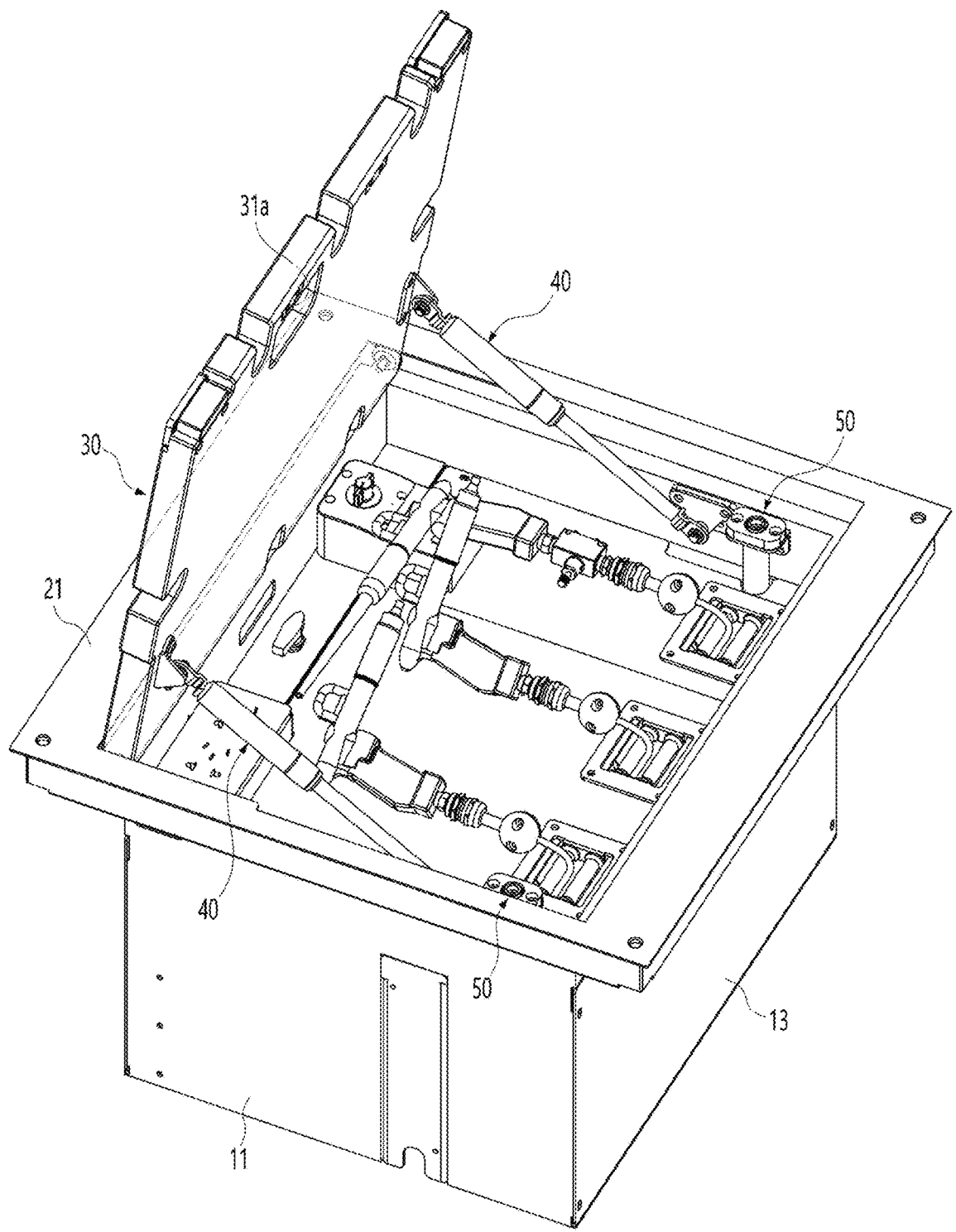
FIGS. 10 and 11 are views each showing a method of using a utility box according to an embodiment of the present disclosure.

In the case where the cover plate 30 is pulled upward not causing the rolling motion of the wheel 81, the cover plate 30 may be moved to an opened position as shown in FIG. 10.

Figure 11:
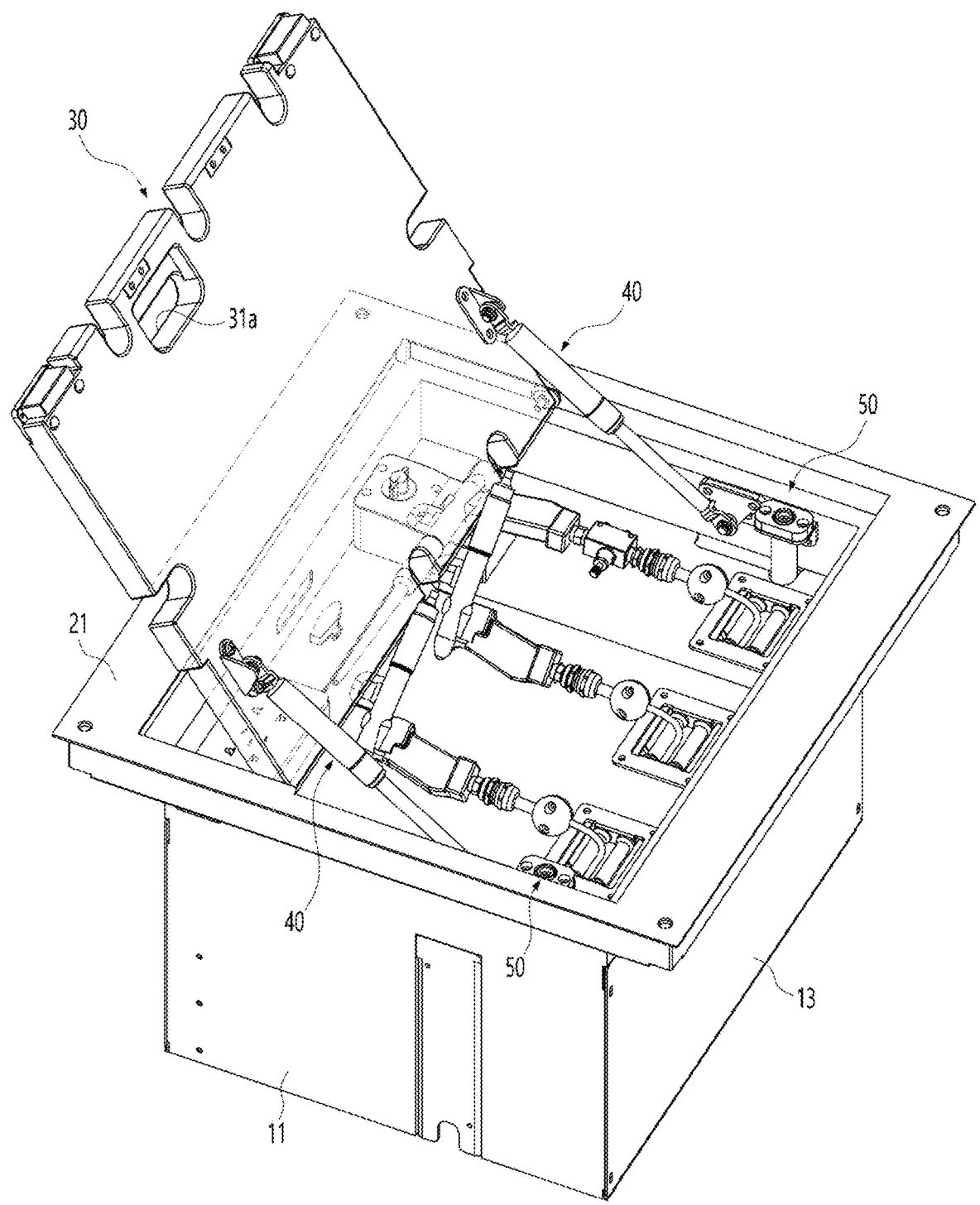
Figure 12:
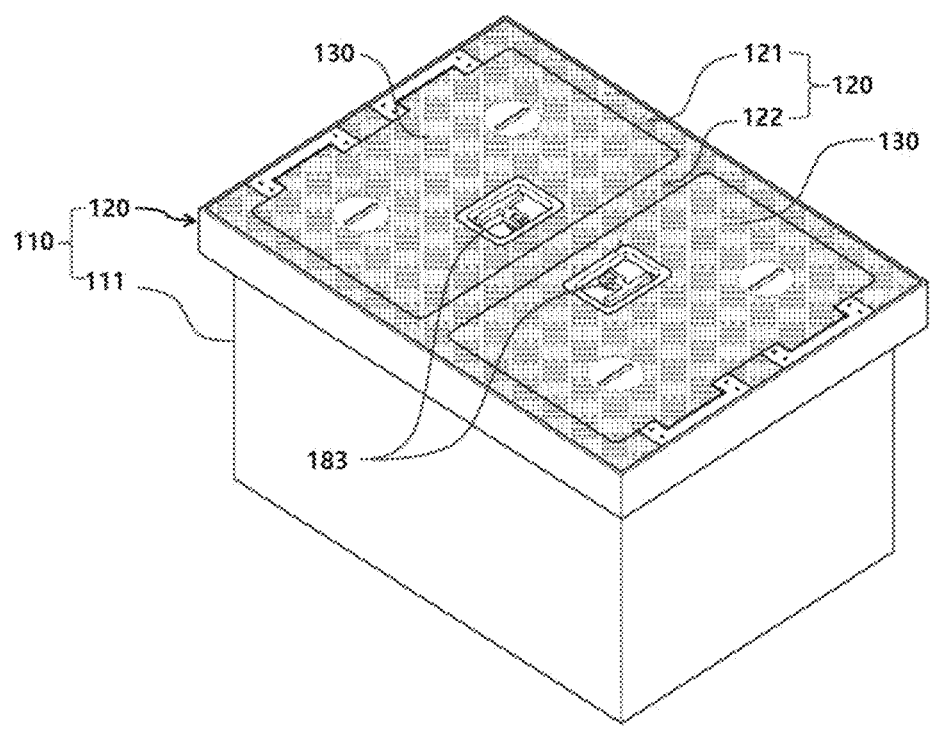
FIG. 12 is a perspective view showing a conventional utility box.
Figure 13:
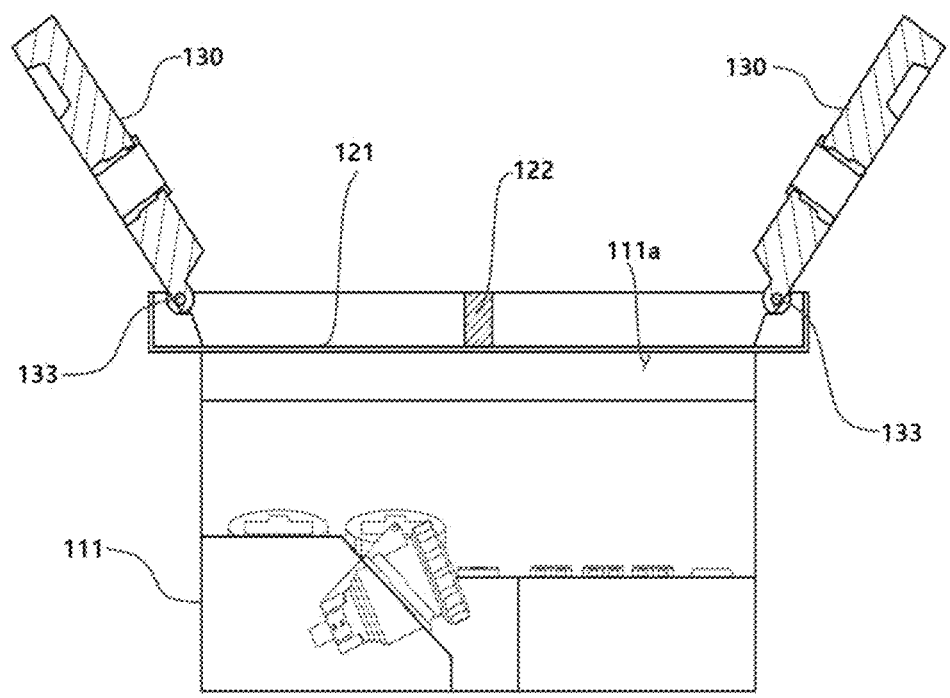
FIG. 13 is a cross-sectional view showing a utility box having a conventional cover plate in an opened position.

In the case where the cover plate 30 is pulled upward causing the rolling motion of the wheel 81, the cover plate 30 may be moved to an opened position as shown in FIG. 2 (i.e., the cover plate is disposed in a direction substantially perpendicular to the lower horizontal guide surface) or an opened position as shown in FIG. 11 (i.e., the cover plate is disposed in a direction having an obtuse angle to a top surface of the box partition wall).

In the state where the cover plate 30 is disposed in the opened position as shown in FIG. 2, 10 or 11, the upper space of the box body 11 may be accessible not only through an "F" direction (see FIG. 2) but also through a "B" direction (see FIG. 2). Accordingly, in the state where the cover plate 30 is disposed in the opened position as shown in FIG. 2, 10 or 11, the box opening 11a is accessible from outside the box in four directions.

In the state where the cover plate 30 reaches the opened position, it is possible to use the air gun or the like installed in the lower space of the box body 11 (i.e., the space below the box partition wall) or the upper space of the box body 11 (i.e., the space above the box partition wall). When the tube 203 is pulled out through a U-shaped groove formed at the edge of the cover plate 30, the air gun 201 may be used in a state where the cover plate 30 is disposed in the closed position.

Meanwhile, the cover plate 30 is returned to the closed position by pressing the cover plate 30 downward.

In a state where the utility box according to an embodiment of the present disclosure is installed, the cover plate 30 is restrained to the box 10 by the cover plate opening/closing support 40. Therefore, the cover plate 30 may be prevented from being separated from the box 10, thereby preventing a safety accident caused by the separation of the cover plate 30.

Meanwhile, the above embodiment describes that the cover plate opening/closing support 40 is configured to include the cover plate opening/closing support spring 43. However, it is possible to implement the present disclosure omitting the cover plate opening/closing support spring (i.e., removing a sealing property between the cover plate opening/closing support cylinder and the cover plate opening/closing support piston).

As described above, in the utility box according to an embodiment of the present disclosure: the box body 11 has the pair of lower horizontal guide surfaces 11b disposed parallel to each other at outer sides of the box opening 11a, respectively; the shoulder body 21 has the pair of perpendicular guide surfaces 21a which are disposed on the inner circumferential surfaces of the shoulder body 21 and simultaneously at the outer sides of the lower horizontal guide surfaces 11b to be perpendicular to the lower horizontal guide surfaces 11b, respectively; the pair of upper horizontal guide surfaces 22 are disposed above and parallel to the lower horizontal guide surfaces 11b, started from longitudinal ends of the perpendicular guide surfaces 21a on the same sides as the upper horizontal guide surfaces 22, respectively, and formed to extend from the top ends of the perpendicular guide surfaces 21a toward the inside of the box body 11, respectively. Meanwhile, the cover plate 30 is formed to have the cover plate wide width portion 31 having the same width as the separation distance between the perpendicular guide surfaces 21a and the cover plate narrow width portion 32 formed to extend from the cover plate wide width portion 31 to have the width smaller than the cover plate wide width portion 31; the cover plate 30 is installed in such a manner that the cover plate wide width portion 31 is supported on the lower horizontal guide surfaces 11*b* and the cover plate narrow width portion 32 enters between the upper horizontal guide surfaces 22; and the cover plate 30 is provided with the pair of wheels 81 each installed on the side of the cover plate narrow width portion 32 to be rolling moved along the lower horizontal guide surface 11*b* between the bottom of the upper horizontal guide surface 22 and the lower horizontal guide surface 11*b*, and the cover plate opening/closing support 40 including the cover plate opening/closing support cylinder 41 and the cover plate opening/closing support piston 42 installed to have one end entering the cover plate opening/closing support cylinder 41, in which either one of a free end of the cover plate opening/closing support cylinder 41 and a free end of the cover plate opening/closing support piston 42 is pivotally coupled to the bottom surface of the cover plate 30, and the other end is pivotally coupled to the box body 11. In this manner, it is possible to provide the utility box in which its box body 11 has improved inner space utilization (by increasing the number of the opened position in which the cover plate may be disposed, by making the box opening be accessible from outer side the box in the four directions, and by having no structure interrupting the operation to enter the inner space of the box body in the center of the box opening) and the region of its cover plate 30 has a simple structure (because there is a single cover plate and the cover plate is restrained to the box by the cover plate opening/closing support).

In addition, by configuring the cover plate opening/closing support 40 to include the cover plate opening/closing support spring 43, it is possible to reduce an amount of shock delivered from the cover plate 30 to the box 10 even when a large closing force is applied to the cover plate 30 during the closing operation of the cover plate 30.

In addition, by installing the contact shock absorber 50 on the box body 11, it is possible to reduce an amount of shock delivered from the cover plate 30 to the box 10 even when a large closing force is applied to the cover plate 30 when the cover plate 30 reaches the closed position.

In addition, the cover plate 30 may be stably held in the closed position by having the region of the lower horizontal guide surface 11*b* made of the magnetic material and by attaching the magnet 82 to the cover plate wide width portion 31 so that the magnetic force acts on the region of the lower horizontal guide surface 11*b* when the cover plate 30 is in the closed position.

Therefore, according to the present disclosure: the box body has the pair of lower horizontal guide surfaces disposed parallel to each other at outer sides of the box opening, respectively; the shoulder body has the pair of perpendicular guide surfaces which are disposed on the inner circumferential surfaces of the shoulder body and simultaneously at the outer sides of the lower horizontal guide surfaces to be perpendicular to the lower horizontal guide surfaces, respectively; the pair of upper horizontal guide surfaces are disposed above and parallel to the lower horizontal guide surfaces, started from longitudinal ends of the perpendicular guide surfaces on the same sides as the upper horizontal guide surfaces, respectively, and formed to extend from the top ends of the perpendicular guide surfaces toward the inside of the box body, respectively. Meanwhile, the cover plate is formed to have the cover plate wide width portion having the same width as the separation distance between the perpendicular guide surfaces and the cover plate narrow width portion formed to extend from the cover plate wide width portion to have the width smaller than the cover plate wide width portion; the cover plate is installed in such a manner that the cover plate wide width portion is supported on the lower horizontal guide surfaces and the cover plate narrow width portion enters between the upper horizontal guide surfaces; and the cover plate is provided with the pair of wheels each installed on the side of the cover plate narrow width portion to be rolling moved along the lower horizontal guide surface between a bottom of the upper horizontal guide surface and the lower horizontal guide surface, and the cover plate opening/closing support including the cover plate opening/closing support cylinder and the cover plate opening/closing support piston installed to have one end entering the cover plate opening/closing support cylinder, in which either one of a free end of the cover plate opening/closing support cylinder and a free end of the cover plate opening/closing support piston is pivotally coupled to the bottom surface of the cover plate, and the other end is pivotally coupled to the box body. In this manner, it is possible to provide the utility box in which its box body has improved inner space utilization (by increasing the number of the opened position in which the cover plate may be disposed, by making the box opening be accessible from outside the box in the four directions, and by having no structure interrupting the operation to enter the inner space of the box body in the center of the box opening) and the region of its cover plate has a simple structure (because there is a single cover plate and the cover plate is restrained to the box by the cover plate opening/closing support).

What is claimed is:

1. A utility box comprising:
    a concave-shaped box having a box opening on a top end of the concave-shaped box; and
    a cover plate installed on the concave-shaped box to cover the box opening;
    wherein the concave-shaped box has a box body and a box shoulder;
    the box body has a box opening formed on the top end of the concave-shaped box and a pair of lower horizontal guide surfaces disposed parallel to each other at outer sides of the box opening to form straight lines, respectively;
    the box shoulder having a shoulder body and a pair of upper horizontal guide surfaces;
    the shoulder body is formed to extend from a top end of the box body to have an inner circumferential surface in a shape of a closed loop and formed to have a pair of perpendicular guide surfaces which are disposed parallel to each other on inner circumferential surfaces of the shoulder body to form straight lines, respectively, and simultaneously disposed at outer sides of the lower horizontal guide surfaces to be perpendicular to the lower horizontal guide surfaces, respectively;
    the pair of upper horizontal guide surfaces are disposed above and parallel to the lower horizontal guide surfaces, started from longitudinal ends of the perpendicular guide surfaces on the same sides as the upper horizontal guide surfaces, respectively, and formed to extend from top ends of the perpendicular guide surfaces toward the inside of the box body to have length sections shorter than the lower horizontal guide surfaces, respectively;
    the cover plate is formed to have a cover plate wide width portion having the same width as a separation distance between the perpendicular guide surfaces and a cover plate narrow width portion formed to extend from the cover plate wide width portion to have a width smaller than the cover plate wide width portion;

the cover plate is installed in such a manner that the cover plate wide width portion is supported on the lower horizontal guide surfaces and the cover plate narrow width portion enters between the upper horizontal guide surfaces;

the cover plate is provided with a pair of wheels and a cover plate opening/closing support;

the pair of wheels each are installed on a side of the cover plate narrow width portion to be rolling moved along the lower horizontal guide surface between a bottom of the upper horizontal guide surface and the lower horizontal guide surface;

the cover plate opening/closing support includes a cover plate opening/closing support cylinder and a cover plate opening/closing support piston installed to have one end entering the cover plate opening/closing support cylinder;

either one of a free end of the cover plate opening/closing support cylinder and a free end of the cover plate opening/closing support piston is pivotally coupled to a bottom surface of the cover plate, and the other end is pivotally coupled to the box body; and the cover plate opening/closing support is operated so that more of a section of the cover plate opening/closing support piston enters the cover plate opening closing support cylinder while the cover plate is moved from an opened position to a closed position, and so that less of the section of the cover plate opening/closing support piston enters the cover plate opening/closing support cylinder while the cover plate is moved from the closed position to the opened position.

2. The utility box according to claim 1, wherein the cover plate opening/closing support further includes a cover plate opening/closing support spring installed in the cover plate opening/closing support cylinder so that as more of the section of the cover plate opening/closing support piston enters the cover plate opening/closing support cylinder, a damping force is generated to reduce a speed increasing the entry section.

3. The utility box according to claim 1, further comprising a contact shock absorber including:

a contact shock absorber cylinder;

a contact shock absorber piston installed to have one end entering the contact shock absorber cylinder;

a contact shock absorber spring installed in the contact shock absorber cylinder so that as more of a section of the contact shock absorber piston enters the contact shock absorber cylinder, a damping force is generated to reduce a speed increasing the entry section;

the contact shock absorber is fixedly installed to the box body by the contact shock absorber cylinder in such a manner that a top end of the contact shock absorber cylinder is disposed lower than the lower horizontal guide surface, a top end of the contact shock absorber piston is disposed higher than the lower horizontal guide surface, and the contact shock absorber cylinder is disposed in a height direction of the box body.

4. The utility box according to claim 1, wherein the box body has a region of the lower horizontal guide surfaces made of magnetic material; and the box body further includes a magnet attached to the cover plate wide width portion so that a magnetic force acts on the region of the lower horizontal guide surfaces when the cover plate is in the closed position.

* * * * *